(12) United States Patent
Citver et al.

(10) Patent No.: US 9,008,740 B2
(45) Date of Patent: Apr. 14, 2015

(54) TECHNIQUES FOR PROTECTING A SUPERCONDUCTING (SC) TAPE

(75) Inventors: Gregory Citver, Danvers, MA (US);
Semaan Fersan, Hamilton, MA (US);
Kasegn D. Tekletsadik, Middleton, MA (US); Scott Nickerson, Plaistow, NH (US); Charles L. Stanley, Amesbury, MA (US); Eric D. Hermanson, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 109 days.

(21) Appl. No.: 13/299,131

(22) Filed: Nov. 17, 2011

(65) Prior Publication Data
US 2013/0130913 A1    May 23, 2013

(51) Int. Cl.
*H01L 39/24*    (2006.01)
*H01L 39/02*    (2006.01)
*H01L 39/14*    (2006.01)
*H01L 39/16*    (2006.01)
*H01F 6/06*    (2006.01)

(52) U.S. Cl.
CPC .............. *H01L 39/02* (2013.01); *H01L 39/14* (2013.01); *H01L 39/16* (2013.01); *H01F 6/06* (2013.01)

(58) Field of Classification Search
USPC .................. 505/230, 231, 234, 237
See application file for complete search history.

(56) References Cited

U.S. PATENT DOCUMENTS

| | | |
|---|---|---|
| 3,200,299 A | 8/1965 | Autler |
| 3,444,307 A | 5/1969 | Kafka |
| 4,910,626 A | 3/1990 | Collet et al. |
| 4,966,886 A * | 10/1990 | Hoshiko ............ 505/230 |
| 4,994,932 A | 2/1991 | Okamoto et al. |
| 2010/0179064 A1* | 7/2010 | Willen et al. ........ 505/230 |

FOREIGN PATENT DOCUMENTS

| | | |
|---|---|---|
| EP | 0339800 A2 | 11/1989 |
| EP | 1217666 A1 | 6/2002 |
| JP | 2001067949 A | 3/2001 |
| WO | 2008148390 A1 | 12/2008 |

OTHER PUBLICATIONS

Translation of JP2001-67949.*

* cited by examiner

*Primary Examiner* — Colleen Dunn

(57) ABSTRACT

Techniques for protecting a superconducting (SC) article are disclosed. The techniques may be realized as an apparatus for protecting a superconducting (SC) article. The apparatus may comprise a porous sleeve configured to fit around the superconducting (SC) article. The porous sleeve may be made of non-conductive, dielectric material.

11 Claims, 4 Drawing Sheets

# TECHNIQUES FOR PROTECTING A SUPERCONDUCTING (SC) TAPE

FIELD OF THE DISCLOSURE

The present disclosure relates generally to superconducting (SC) systems, more particularly, to techniques for protecting a superconducting (SC) article.

BACKGROUND OF THE DISCLOSURE

In electric power transmission and distribution networks, fault current conditions may occur. A fault current condition is an abrupt surge in the current flowing through the network caused by a fault or a short circuit in the network. Causes of a fault may include lightning striking the network, and downing and grounding of transmission power lines due to severe weather or falling trees. When a fault occurs, a large load appears instantaneously. In response, the network delivers a large amount of current (i.e., overcurrent) to this load or, in the case, the fault. This surge or fault current condition is undesirable and may damage the network or equipment connected to the network. In particular, the network and the equipment connected thereto may burn or, in some cases, explode.

One system used to protect power equipment from damage caused by a fault current is a circuit breaker. When a fault current is detected, the circuit breaker mechanically opens the circuit and disrupts overcurrent from flowing. Because a circuit breaker typically takes 3 to 6 power cycles (up to 0.1 seconds) to be triggered, various network components, such as transmission lines, transformers, and switchgear, may still be damaged.

Another system to limit a fault current and to protect power equipment from damage caused by a fault current is a superconducting fault current limiter (SCFCL) system. Generally, an SCFCL system comprises a superconducting circuit that exhibits almost zero resistivity below a critical temperature level $T_C$, a critical magnetic field level $H_C$, and a critical current level $I_C$. If at least one of these critical level conditions is exceeded, the circuit quenches and exhibits resistivity.

During normal operation, the superconducting circuit of the SCFCL system is maintained below the critical level conditions of $T_C$, $H_C$, and $I_C$. During a fault, one or more of the aforementioned critical level conditions is exceeded. Instantaneously, the superconducting circuit in the SCFCL system is quenched and resistance surges, which in turn limits transmission of the fault current and protects the network and associated equipment from the overload. Following some time delay and after the fault current is cleared, the superconducting circuit returns to normal operation wherein none of the critical level conditions are exceeded and current is again transmitted through the network and the SCFCL system.

The SCFCL system may operate in a direct electrical current (DC) or an alternating electrical current (AC) environment. There may be steady power dissipation from AC losses (i.e., superconducting thermal or hysteresis losses), which may be removed by a cooling system. Conductors, typically in the form of a flat wire or conductive tape, are typically used to transmit electrical energy or signals in the SCFCL system. However, traditional conductive tapes used in SCFCL systems typically result in substantial heat loss. In other words, temperature of these conductive tapes may increase significantly, causing them to expand, which may in turn increase the likelihood of the conductive tapes touching each other. In addition, conductive tapes typically vibrate due to magnetic fields generated by current flowing through the conductive tapes. Therefore, together with the increase in temperature, the vibration of the conductive tapes may increase contact between the conductive tapes, during normal or fault conditions. Such contact, even if minimal, may result in electrical and/or mechanical interference, which may lead to decreased longevity and reliability of the conductive tapes. As a result, protecting conductive tapes from such interference may be an important factor to consider by manufacturers.

Accordingly, in view of the foregoing, it may be understood that there may be significant problems and shortcomings associated with current technologies for conductive tapes used superconducting (SC) systems.

SUMMARY OF THE DISCLOSURE

Techniques for protecting a superconducting (SC) article are disclosed. In one particular exemplary embodiment, the techniques may be realized as an apparatus for protecting a superconducting (SC) article. The apparatus may comprise a porous sleeve configured to fit around the superconducting (SC) article. The porous sleeve may be made of non-conductive, dielectric material.

In accordance with other aspects of this particular exemplary embodiment, the porous sleeve may be configured to handle extreme temperatures. The extreme temperatures may comprise at least one of cryogenic temperatures and fault condition temperatures.

In accordance with further aspects of this particular exemplary embodiment, the porous sleeve may be configured to allow flow of coolant to the superconducting article.

In accordance with additional aspects of this particular exemplary embodiment, the non-conductive, dielectric material may be flexible.

In accordance with other aspects of this particular exemplary embodiment, the porous sleeve may prevent the superconducting (SC) article from direct contact with an object outside of the porous sleeve. The outside object may be another superconducting (SC) article.

In accordance with further aspects of this particular exemplary embodiment, the porous sleeve may comprise material comprising at least one of silk, cotton, and wool.

In accordance with additional aspects of this particular exemplary embodiment, the porous sleeve may comprise material comprising at least one of polytetrafluoroethylene (PTFE) and polyethylene terephthalate (PET).

In accordance with other aspects of this particular exemplary embodiment, the porous sleeve may be configured to be used in at least one of a superconducting fault current limiter (SCFCL) system, a superconducting (SC) magnet system, and a superconducting (SC) storage system.

In accordance with further aspects of this particular exemplary embodiment, the porous sleeve may be spaced apart from the superconducting (SC) article.

In another particular exemplary embodiment, the techniques may be realized as an apparatus for carrying current. The apparatus may comprise a superconductor array contained in coolant. The superconductor array may comprise a plurality of superconducting (SC) articles, and a porous dielectric layer, interposed between two superconducting (SC) articles and configured to allow coolant to flow therethrough.

In accordance with additional aspects of this particular exemplary embodiment, the porous dielectric layer may be in contact with one of the superconducting (SC) articles.

In accordance with other aspects of this particular exemplary embodiment, the porous dielectric layer may be spaced apart from the superconducting (SC) articles.

In accordance with further aspects of this particular exemplary embodiment, the porous dielectric layer may be a porous sleeve that is configured to fit around one superconducting (SC) article.

In accordance with additional aspects of this particular exemplary embodiment, the apparatus may further comprise another porous sleeve that is configured to fit around another superconducting (SC) article.

In accordance with other aspects of this particular exemplary embodiment, the porous sleeve may be coupled to the another porous sleeve.

In accordance with further aspects of this particular exemplary embodiment, the porous sleeve and the another porous sleeve may be in a stacked configuration.

In accordance with additional aspects of this particular exemplary embodiment, the porous sleeve and the another porous sleeve may be in a side-by-side configuration.

In accordance with other aspects of this particular exemplary embodiment, the superconductor array is configured to handle extreme temperatures. The extreme temperatures may comprise at least one of cryogenic temperatures and fault condition temperatures.

In accordance with further aspects of this particular exemplary embodiment, the porous dielectric layer may be flexible.

In accordance with additional aspects of this particular exemplary embodiment, the porous dielectric layer may prevent the plurality of superconducting (SC) articles from directly contacting one another.

In accordance with other aspects of this particular exemplary embodiment, the porous dielectric layer may comprise material comprising at least one of silk, cotton, wool, polytetrafluoroethylene (PTFE), and polyethylene terephthalate (PET).

In another particular exemplary embodiment, the techniques may be realized as an apparatus for carrying current. The apparatus may comprise a tank, coolant contained in the tank, and a superconductor array contained in the tank. The superconductor array may comprise a plurality of superconducting (SC) articles, and a plurality of porous dielectric sleeves. Each of the plurality of porous dielectric sleeves may be configured to fit around one of the plurality of superconducting (SC) articles and configured to allow coolant to flow therethrough.

In accordance with additional aspects of this particular exemplary embodiment, the superconductor array may be configured to be used in at least one of a superconducting fault current limiter (SCFCL) system, a superconducting (SC) magnet system, and a superconducting (SC) storage system.

In accordance with other aspects of this particular exemplary embodiment, the porous dielectric sleeve may comprise material comprising at least one of silk, cotton, wool, polytetrafluoroethylene (PTFE), and polyethylene terephthalate (PET).

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide techniques for protecting a superconducting (SC) article.

A superconducting fault current limiter (SCFCL) system may comprise an enclosure electrically decoupled from ground, such that the enclosure is electrically isolated from a ground potential. In some embodiments, the enclosure may be grounded. The SCFCL system may also have first and second terminals, electrically connected to one or more current carrying lines, and a first superconducting circuit contained within the enclosure, wherein the first superconducting circuit may be electrically connected to the first and second terminals.

Figure 1:
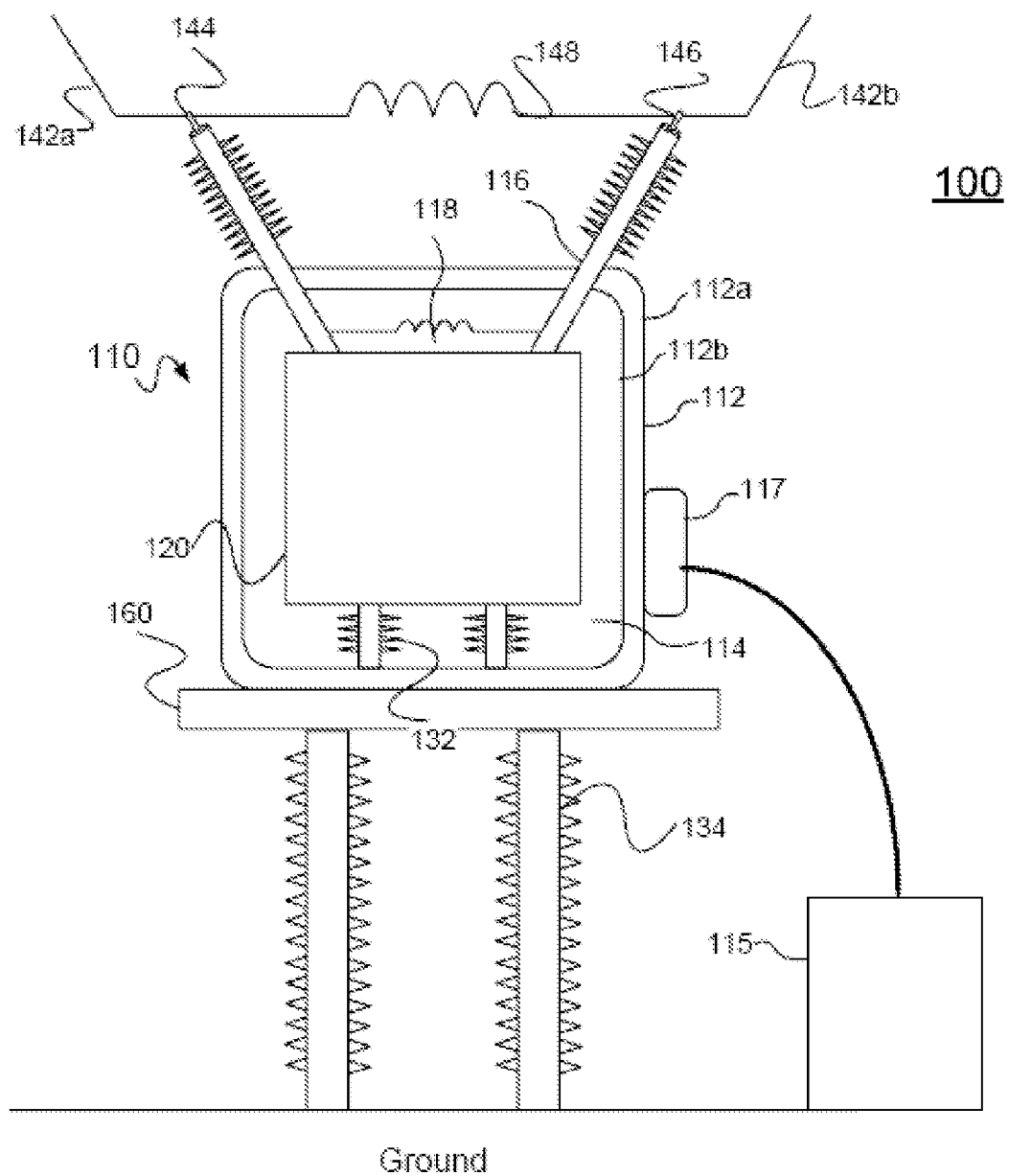
FIG. 1 depicts a superconducting fault current limiter (SCFCL) system using superconducting (SC) articles, according to an embodiment of the present disclosure.

Referring to FIG. 1, there is shown an exemplary system using a superconducting (SC) article, according to an embodiment of the present disclosure. In the present embodiment, a superconducting fault current limiter (SCFCL) system 100 using a superconducting (SC) article is shown. Although the present embodiment focuses on SCFCL system 100, it should be appreciated that the present disclosure is not limited thereto. Those skilled in the art should recognize that other electrical systems comprising conductive articles that are exposed to varying temperatures, e.g., wires, cables, or tapes, may be just as applicable.

The SCFCL system 100 of the present embodiment may comprise one or more modules 110. For the purposes of clarity and simplicity, the description of SCFCL system 100 will be limited to one single phase module 110 although various other embodiments using more than one phase module may be contemplated in accordance with the present disclosure.

The phase module 110 of SCFCL system 100 may comprise an enclosure or tank 112 defining a chamber therein. In one embodiment, the enclosure or tank 112 may be thermally insulated. In other embodiments, the enclosure or tank 112 may be electrically insulated. The enclosure or tank 112 may be made from a variety of materials, such as fiberglass or other dielectric materials. In other embodiments, the enclosure or tank 112 may be made of an electrically conductive material, such as metal (e.g., stainless steel, copper, aluminum, or other metal). The enclosure of tank 112 may also comprise an outer layer 112a and an inner layer 112b. An insulating medium (e.g., a thermal and/or electrically insulating medium) may be interposed between the outer layer 112a and the inner layer 112b.

In some embodiments, the enclosure or tank 112 may or may not be connected to earth ground. In the configuration depicted in FIG. 1, the enclosure or tank 112 is connected to earth ground, and thus may be referred to as a floating tank configuration. In another embodiment, the enclosure or tank 112 may be electrically coupled to transmission/distribution network current lines 142a and 142b and maintained at live voltage.

Within the enclosure or tank 112, there may be one or more fault current limiting units 120, which, for the purpose of clarity and simplicity, are shown as a block. The module 110 may also comprise one or more electrical bushings 116. Distal ends of the bushings 116 may be coupled to transmission network current lines 142a and 142b via terminals 144 and 146, respectively. This configuration may allow the module 110 to be coupled to a transmission/distribution network (not shown). The current lines 142a and 142b may be transmission lines to transmit power from one location to another (e.g., current source to current end users), or power or current distribution lines.

The bushings 116 may comprise conductors having inner conductive material that connects the terminals 144 and 146 to the fault current limiting unit 120. Meanwhile, the outer layer 112a may be used to insulate the enclosure or tank 112 from an inner conductive material, thereby allowing the enclosure or tank 112 and the terminals 144 and 146 to be at different electrical potentials. In some embodiments, the module 110 may comprise an internal shunt reactor 118 or an external shunt reactor 148, or both, to connect the conductive material contained in the electrical bushings 116.

Several insulated supports may be used to insulate various voltages from one another. For example, insulated supports 132 within the enclosure or tank 112 may be used to isolate the voltage of the module 120 from the enclosure or tank 112. Additional supports 134 may be used to isolate a platform 160 and the components resting thereon from ground.

The temperature of the fault current limiting unit 120 may be maintained at a desired temperature range using coolant 114 in the enclosure or tank 112. In some embodiments, the fault current limiting unit 120 may be cooled and maintained at a low temperature range, for example, at or around ~77° K. The coolant 114 may include liquid nitrogen or other cryogenic fluid or gas. The coolant 114 itself may be cooled using an electrical cooling system, which may further comprise a cryogenic compressor 117 and a transformer 115. Other types of cooling systems may also be used to keep the coolant 114 at low temperatures.

Flat conductive tape, such as a superconducting (SC) tape, may be used to transmit electrical energy or signals in the SCFCL system 100. However, those in the art will appreciate that the present disclosure does not exclude using (SC) article in a form of a wire, a cable, or any other forms. During a fault condition, the superconducting (SC) article may be exposed to extreme conditions and may exhibit excessive heating due to power dissipation, as described above. Heat may expand the superconducting (SC) article, which may cause the superconducting (SC) article to touch another superconducting (SC) article or other object in the SCFCL system 110. Vibrational movement caused by magnetic fields from current in the superconducting (SC) article, along with heat expansion, may also or further increase likelihood of contact with other superconducting (SC) articles or objects.

Because superconducting (SC) articles of the SCFCL system 100 are typically adjacent to one another (e.g., side-by-side or stacked), such contact may cause mechanical damage, e.g., scraping and scratching of these superconducting (SC) articles. This may result in deterioration of performance, reliability, and cost, as these superconducting (SC) articles may be expensive and burdensome to replace. There may also be electrical interference that results from continuous and prolonged contact to and by the superconducting (SC) articles.

Figure 2:
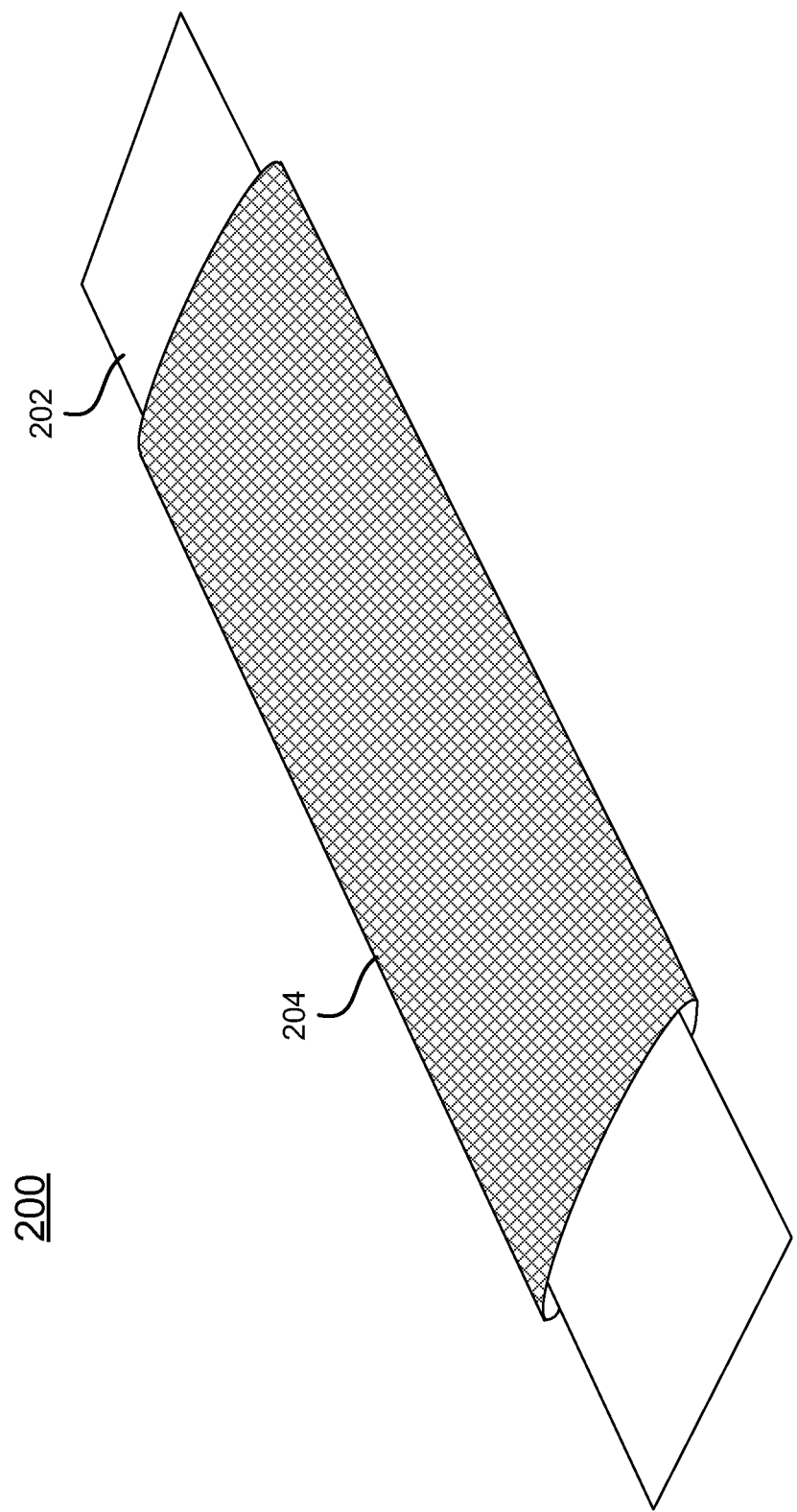
FIG. 2 depicts a sleeve configuration for protecting a superconducting (SC) article, according to various embodiments of the present disclosure.

FIG. 2 depicts a sleeve configuration 200 for a protecting superconducting (SC) article, according to various embodiments of the present disclosure. In this configuration 200, a superconducting (SC) tape 202 may include a sleeve 204.

The superconducting (SC) tape 202 may contain multiple layers, one or more of which may be a high temperature superconductor (HTS) layer. Examples of an HTS in the layer may include copper oxide based superconductor such as YBCO or other rare earth BCO (ReBCO), BSCCO, TBCCO, or $HgBa_2Ca_2Cu_3O_x$, or other iron (Fe) based HTS. Above and/or below the HTS layer, there may be one or more layers formed from a variety of conductive materials. These conductive materials may include copper, aluminum, silver, steel, or other conductive material or composite.

The sleeve 204 may be configured to fit around the superconducting (SC) tape. In some embodiments, the sleeve 204 may be configured to fit tightly around the superconducting (SC) tape. This may prevent excessive sleeve material from interfering with normal operation of the SCFCL system 100. In other embodiments, the sleeve 204 may be configured to fit loosely around the superconducting (SC) tape 202. This may allow great breathability and flow of liquid and/or gas to the superconducting (SC) tape 202, which in turn may not restrict cooling of the superconducting (SC) tape 202.

The sleeve 204 may be formed of a non-conductive, dielectric material. In other words, the sleeve 204 may provide electrical insulation for the superconducting (SC) tape 202 from external conditions.

In some embodiments, the sleeve 204 may be configured to handle extreme conditions. These may include fluctuations in temperature, vibrational movement, extreme temperatures, or other environmental factors. Because the superconducting (SC) tape 202 may be subject these extreme conditions, the sleeve 204 may be made of durable material, which may withstand these conditions as well.

For example, since cryogenic temperatures may be reach ~65° K or less and fault temperatures may reach ~600° K or more, the sleeve 204 may be formed of a durable material able handle these conditions.

In some embodiments, the sleeve 204 may be made of fabric or mesh-like materials. Such materials may be able to absorb and retain coolant (e.g., liquid nitrogen or other cryogen) and may also provide greater tape recovery (and decrease recover time), which may be formed around the superconducting (SC) tape during a fault condition. Additionally, absorptive qualities of the fabric may help protect from burning as temperatures rise.

Some materials that may be used to form the sleeve 204 may include silk, cotton, wool, Teflon® (or Polytetrafluoroethylene (PTFE)), polyethylene terephthalate (PET), or a combination thereof. Other various materials, fabric, meshes, and compounds, may also be provided.

As shown below, Table 1 provides an exemplary comparison of two exemplary materials (Teflon® and silk) under various conditions.

TABLE 1

| Conditions/Characteristics | Teflon ® | Silk |
|---|---|---|
| Maximum operating temperature | 260° C. | 300-400° C. |
| Melting temp/burning temp | 335° C. (melt) | 300-400° C. (burn) |

TABLE 1-continued

| Conditions/Characteristics | Teflon ® | Silk |
|---|---|---|
| Absorption of liquid | <0.01% | ~38% |
| Hardness at 77° K | Hard | Soft |
| Mechanical strength (wear/tear) | Strong | Not strong |
| Flexibility at 77° K | Less flexible | Unchanged |
| Protection from hard particles | Large-cell mesh not protect | Protects from particles (~filter) |
| Weight (kg/100 m) | 2200 | 0.05 |

It should be appreciated that while Teflon® and silk may have varying benefits, the overall advantages of these materials, as well cotton, wool, and polyethylene terephthalate (PET), may be more than sufficient for use in the sleeve 204.

Figure 3A:
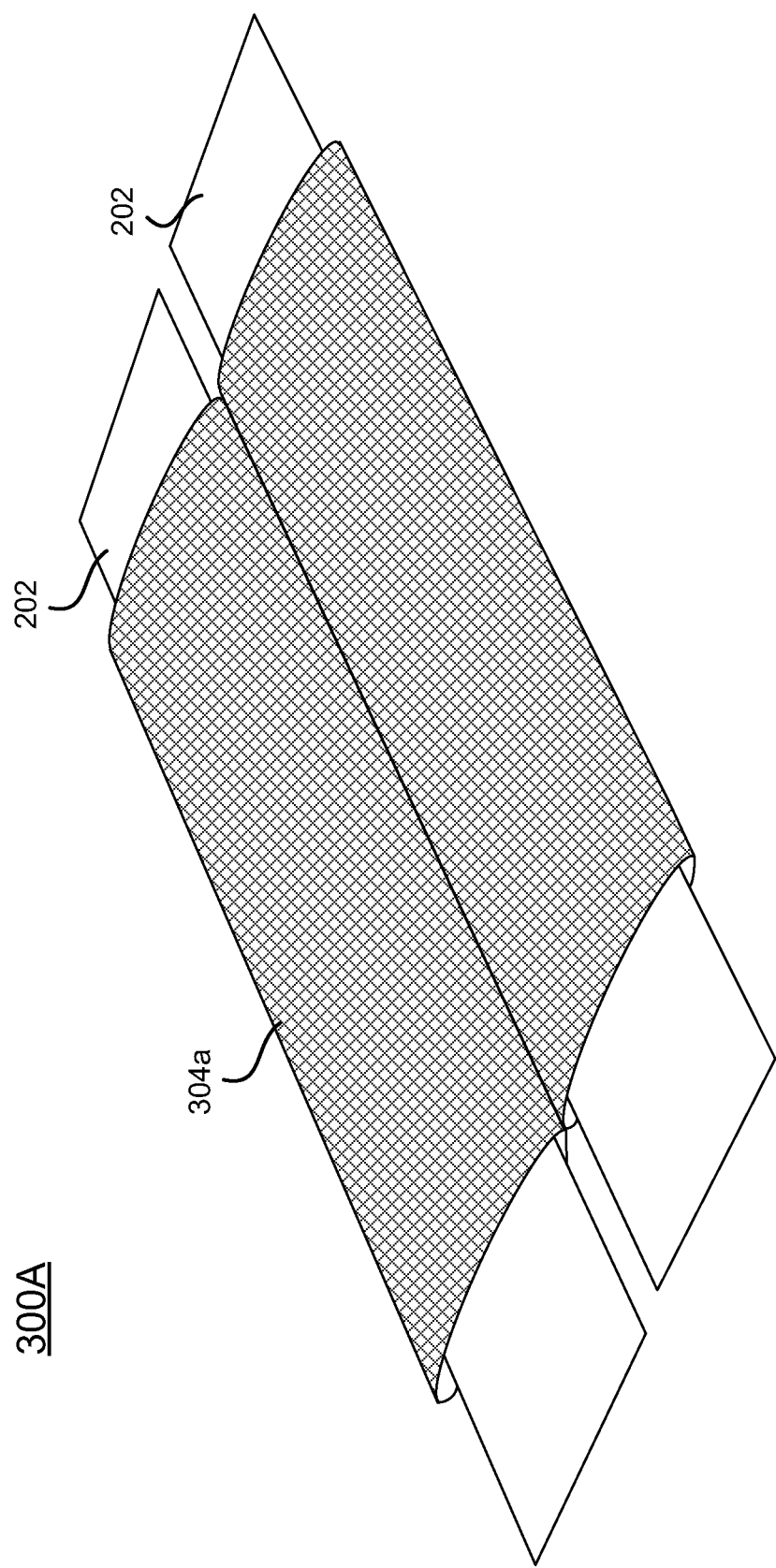
FIG. 3A depicts a multi-sleeve array for protecting superconducting (SC) articles, according to various embodiments of the present disclosure.

FIG. 3A depicts a multi-sleeve array 300A for protecting superconducting (SC) articles, according to various embodiments of the present disclosure. In this multi-sleeve array 300A, two superconducting (SC) tapes 202 may be placed near each other. In this example, the superconducting (SC) tapes 202 may be adjacent to each other in a side-by-side configuration. Accordingly, a multi-sleeve 304a may be used to protect these superconducting (SC) tapes 202.

The multi-sleeve 304a may comprise all the characteristics of a single sleeve 204, as described above with reference to FIG. 2. However, the multi-sleeve 304a may effectively function as two or more sleeves coupled together. In this case, the multi-sleeve 304a may be coupled together in a side-by-side configuration, as depicted in FIG. 3A. As described above, a superconducting (SC) tape may often be positioned near another superconducting (SC) tape. Therefore, using a multi-sleeve 304a may provide protection from contact with other superconducting (SC) tapes or other external objects.

It should be appreciated that while the multi-sleeve array 300A is directed to a multi-sleeve 304a that fits two superconducting (SC) tapes 202, a greater number sleeves may be provided to fit a greater number of side-by-side superconducting (SC) tapes.

Figure 3B:
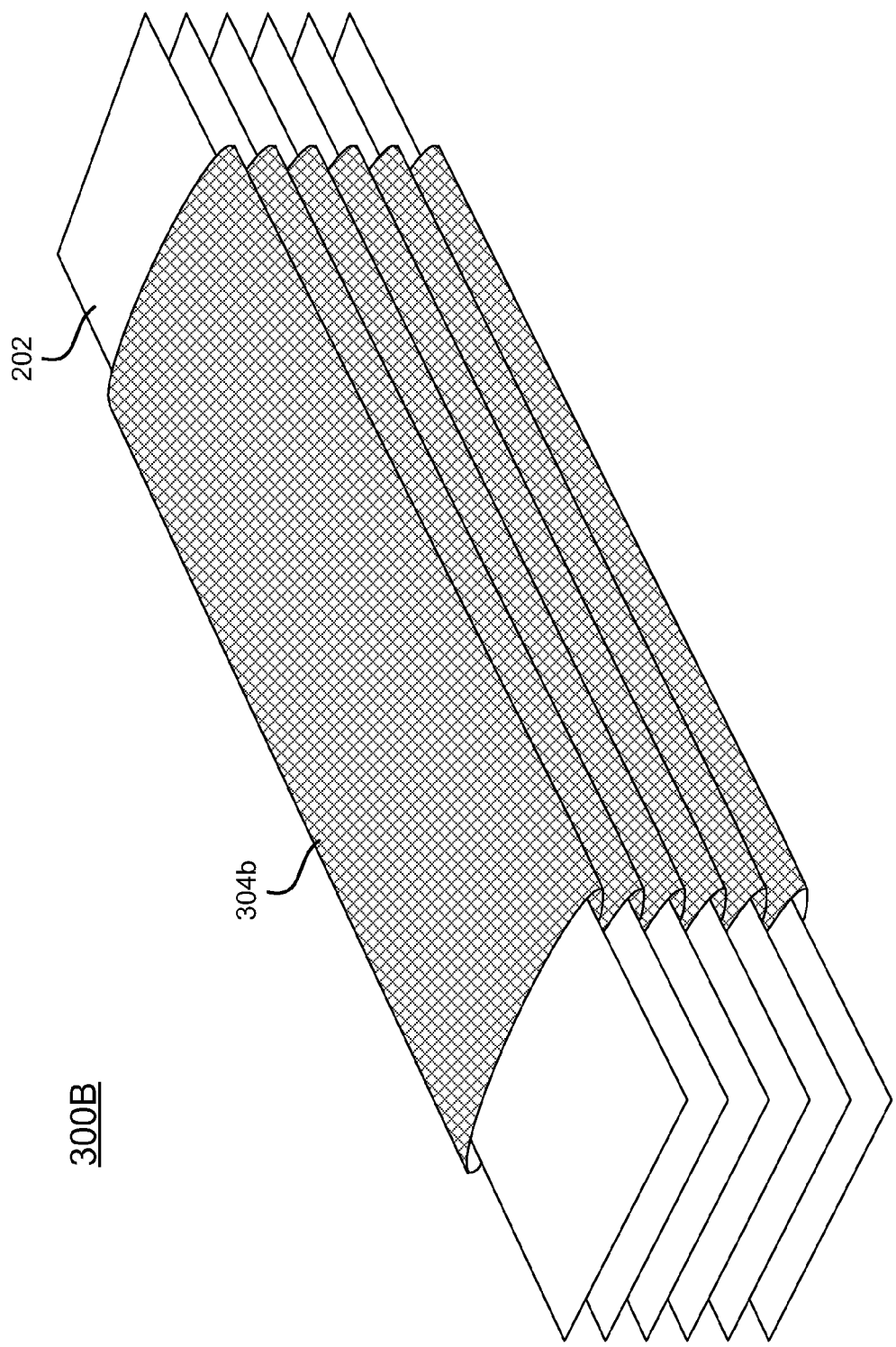
FIG. 3B depicts a multi-sleeve array for protecting superconducting (SC) articles, according to other various embodiments of the present disclosure.

FIG. 3B depicts a multi-sleeve array 300B for protecting superconducting (SC) articles, according to other various embodiments of the present disclosure. In this multi-sleeve array 300B, six superconducting (SC) tapes 202 may be placed near each other. In this example, the superconducting (SC) tapes 202 may be adjacent to each other in a stacked configuration. Accordingly, a multi-sleeve 304b may be used to protect these superconducting (SC) tapes.

The multi-sleeve 304b may comprise all the characteristics of a single sleeve 204, as described above with reference to FIG. 2. However, the multi-sleeve 304b may effectively function as a plurality of sleeves coupled together. In this case, the multi-sleeve 304a may be coupled together in a stacked configuration, as depicted in FIG. 3B. As described above, a superconducting (SC) tape may often be positioned near another superconducting (SC) tape. Therefore, using a multi-sleeve 304b may provide protection from contact with other superconducting (SC) tapes or other external objects.

It should be appreciated that while the multi-sleeve array 300A is directed to a multi-sleeve 304b that fits six superconducting (SC) tapes 202, a greater or lesser number sleeves may be provided to fit a greater or lesser number of side-by-side superconducting (SC) tapes.

It should be appreciated that while embodiments described above are directed to several configurations for a superconducting (SC) sleeve, other various configurations, arrangements, shapes, and/or designs may also be provided. For example, a multi-sleeve array may have a stacked, side-by-side configuration. Other various configurations may also be realized. Other various configurations, shapes, variations, and combinations thereof may also be provided.

It should also be appreciated that embodiments of the sleeve described above are mainly directed to various fabric-based materials, other types of materials may also be used. For example, various porous and/or polymer-based materials may also be used. Other materials, such as glass, plastics, rubbers, epoxy, epoxy-based composite, or other dielectric material, may also be used. It should be appreciated that these materials may not provide the same results or advantages of fabric-based materials, as described above, but may be considered depending on the various application or situation.

It should also be appreciated that while embodiments of the present disclosure are directed to superconducting (SC) tapes, other various articles may be provided, such as wires, cables, or other conductors or materials.

It should also be appreciated that while embodiments of the present disclosure are directed to applications in a superconducting fault current limiter (SCFCL) system, other various applications and implementations may also be provided, such as superconductive (SC) magnets, superconductive (SC) energy storage, and other superconducting applications or other applications using conductor tapes or similar components.

By protecting a superconducting (SC) article with a sleeve, greater lifetime, durability, and cost in the maintenance of the superconducting (SC) tape may be achieved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for carrying current, the apparatus comprising:
a superconductor array immersed in coolant, the superconductor array comprising:
a plurality of superconducting (SC) tapes, each tape comprising first and second flat surfaces; and
a plurality of porous dielectric sleeves, each porous dielectric sleeve surrounding first and second flat surfaces of one of the plurality of superconducting tapes, being interposed between two superconducting (SC) tapes, and being configured to fit loosely around first and second flat surfaces of the one of the superconducting tapes to allow breathability and liquid coolant to flow to a respective superconducting tape of the plurality of superconducting tapes.

2. The apparatus of claim 1, wherein each porous dielectric sleeve is coupled to another porous dielectric sleeve.

3. The apparatus of claim 2, wherein the plurality of porous dielectric sleeves are in a stacked configuration.

4. The apparatus of claim 2, wherein the plurality of porous dielectric sleeves are in a side-by-side configuration.

5. The apparatus of claim 1, wherein the superconductor array is configured to handle extreme temperatures, wherein the extreme temperatures comprise at least one of cryogenic temperatures and fault condition temperatures.

6. The apparatus of claim 1, wherein each porous dielectric sleeve is flexible.

7. The apparatus of claim 1, wherein each porous dielectric sleeve prevents the superconducting (SC) tapes from directly contacting one another.

8. The apparatus of claim 1, wherein each porous dielectric sleeve comprises material comprising at least one of silk, cotton, wool, polytetrafluoroethylene (PTFE), and polyethylene terephthalate (PET).

9. An apparatus for carrying current, the apparatus comprising:
a tank;
coolant contained in the tank;
a superconductor array contained in the tank, the superconductor array comprising:
a plurality of superconducting (SC) tapes, each of the superconducting tape comprises a superconducting layer and one or more layers of conductive materials form on the superconductive layer; and
a plurality of porous dielectric sleeves, wherein each of the plurality of porous dielectric sleeves is configured to fit around and surround one of the plurality of superconducting (SC) tapes, and configured to allow breathability and liquid coolant to flow to a respective superconducting tape of the plurality of superconducting tapes.

10. The apparatus of claim 9, wherein the superconductor array is configured to be used in at least one of a superconducting fault current limiter (SCFCL) system, a superconducting (SC) magnet system, and a superconducting (SC) storage system.

11. The apparatus of claim 9, wherein each porous dielectric sleeve comprises material comprising at least one of silk, cotton, wool, polytetrafluoroethylene (PTFE), and polyethylene terephthalate (PET).

* * * * *